United States Patent [19]
McClure

[11] Patent Number: 5,898,235
[45] Date of Patent: Apr. 27, 1999

[54] INTEGRATED CIRCUIT WITH POWER DISSIPATION CONTROL

[75] Inventor: David C. McClure, Carrollton, Tex.

[73] Assignee: STMicroelectronics, Inc., Carrollton, Tex.

[21] Appl. No.: 08/775,611

[22] Filed: Dec. 31, 1996

[51] Int. Cl.⁶ .................................................. H03K 5/153
[52] U.S. Cl. ........................... 307/64; 327/544; 365/227; 395/750.03; 364/707
[58] Field of Search ...................... 307/64, 66; 327/544; 365/227; 395/750.03; 364/273–273.5, 707

[56] References Cited

U.S. PATENT DOCUMENTS

| | | |
|---|---|---|
| 4,683,382 | 7/1987 | Sakurai ..................................... 365/227 |
| 5,167,024 | 11/1992 | Smith et al. ........................... 364/273.1 |
| 5,483,464 | 1/1996 | Song ............................................ 307/64 |
| 5,513,361 | 4/1996 | Young .................................. 395/750.03 |

*Primary Examiner*—Albert W. Paladini
*Attorney, Agent, or Firm*—Theodore E. Galanthay; Lisa K. Jorgenson; Peter J. Thoma

[57] ABSTRACT

An integrated circuit device such as an SRAM operating in a battery backup mode, or operating in a quiescent mode when deselected in the operation of a portable electronic device, includes a power dissipation control circuit that reduces the voltage on an internal power supply node so that the memory array is powered at a minimum level sufficient to retain the data stored therein intact.

19 Claims, 2 Drawing Sheets

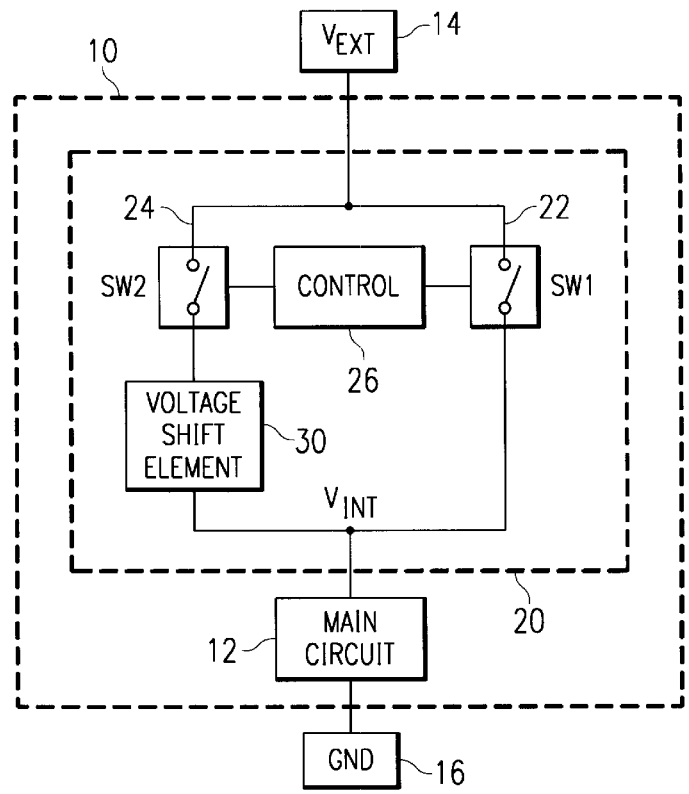
FIG. 1
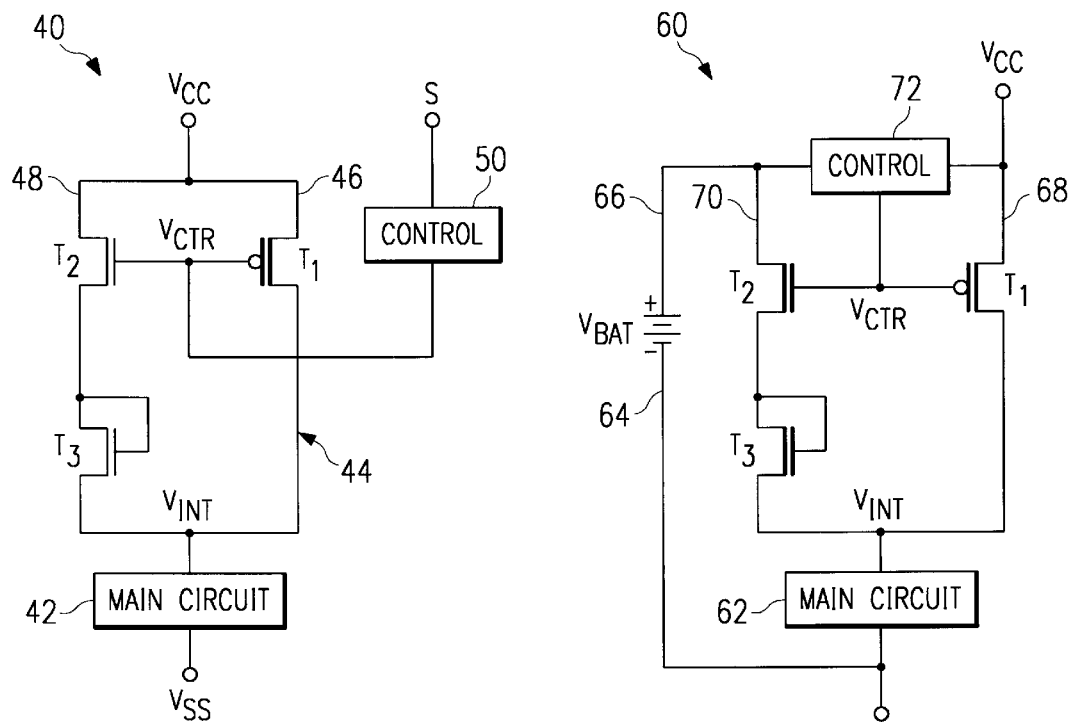
FIG. 2
FIG. 3

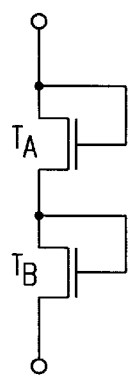
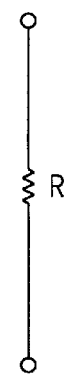
FIG. 4        FIG. 5        FIG. 6
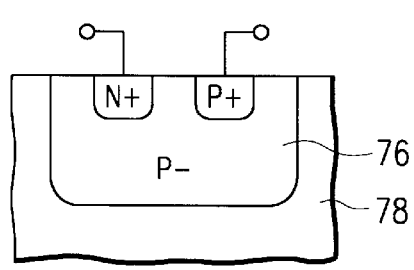
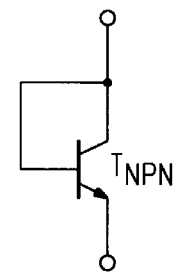
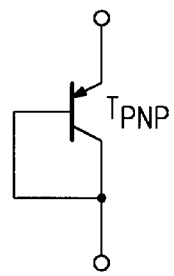
FIG. 7        FIG. 8        FIG. 9
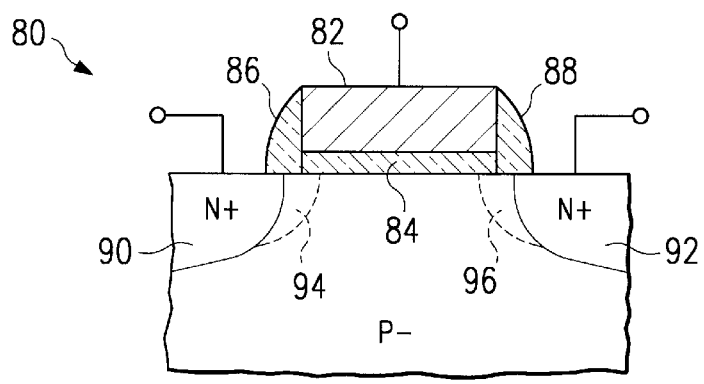
FIG. 10

INTEGRATED CIRCUIT WITH POWER DISSIPATION CONTROL

BACKGROUND OF THE INVENTION

The present invention relates to integrated circuit devices and more particularly to battery-powered integrated circuits with low power consumption.

Many integrated circuits, such as static random access memory ("SRAM") devices, rely on batteries as backup power supplies to retain the data stored within them while the equipment in which they are used is turned off or the power supply to the equipment has failed. Such integrated circuits are becoming more complex, thus placing greater demands on such backup batteries. Although battery technology is improving, increases in battery capabilities are not keeping up with the increasing power requirements of the integrated circuit devices they serve. There is, accordingly, a need to reduce the power consumption of integrated circuits when used in a battery backup mode.

Additionally, portable electronic devices (computers, cellular phones, etc.) rely upon batteries to supply operational power during general use. Such devices employ integrated circuit devices, which contribute to battery power consumption and reduced operating time between battery rechargings. There is, accordingly, a need to reduce the power consumption of integrated circuits used in portable electronic devices in order to extend the time of operation on a single charge of the battery.

SUMMARY OF THE INVENTION

In accordance with the principal object of the present invention, a power dissipation control circuit is included in an integrated circuit device for switching the power supplied to a main circuit of the device from full power to a reduced power depending on the mode of operation of the main circuit.

Another object of the invention is to switch an integrated circuit memory device to a low-power dissipation mode when the device is deselected by external circuitry so that the device merely needs to maintain the status of the stored information without performing input/output operations.

Another object of the invention is to switch an integrated circuit memory device to a low-power dissipation mode during battery backup operation so that a minimum holding voltage is applied to the device in order to maintain the data stored therein for an extended duration.

BRIEF DESCRIPTION OF THE DRAWINGS

Other objects, features and advantages of the invention will be best understood from the following detailed description, read in conjunction with the accompanying drawings, in which:

FIG. 1 is a generalized circuit diagram of a device of the present invention;

FIG. 2 is a circuit diagram of one implementation of the present invention;

FIG. 3 is a circuit diagram of another implementation of the present invention;

FIG. 4 is one embodiment of a subcircuit of the present invention;

FIG. 5 is another embodiment of a subcircuit of the present invention;

FIG. 6 is another embodiment of a subcircuit of the present invention;

FIG. 7 is a cross-section of a PN junction diode used in the subcircuit of FIG. 6;

FIG. 8 is another embodiment of a subcircuit of the present invention;

FIG. 9 is another embodiment of a subcircuit of the present invention; and

FIG. 10 is cross-section of a transistor specially fabricated to provide a relatively high threshold voltage, which may be useful in another embodiment of the present invention.

DETAILED DESCRIPTION OF THE INVENTION

Referring to FIG. 1, an integrated circuit device in accordance with the present invention is indicated by reference numeral 10, designating the circuitry contained within the larger dashed outline. The integrated circuit device 10 includes a main circuit 12, which is preferably a memory circuit such as an SRAM memory array. Conventional SRAMs include so-called "4T" and "6T" types, both being well known in the art. The 4T type SRAM uses four N-channel MOSFETs, (metal-oxide-semiconductor field effect transistors) and two resistors for each memory cell of the memory array. The resistors are typically high resistivity portions of polycrystalline silicon (polysilicon) lines running within the array. The 6T type SRAM uses six MOSFETs, two of which are P-channel transistors and four of which are N-channel transistors.

The integrated circuit device 10 is connected between a high voltage terminal 14 and a low voltage terminal 16, which are respectively labeled the $V_{EXT}$ (indicating an external voltage supply) and GND (indicating a ground terminal). Integrated circuit device 10 includes a power dissipation control circuit contained within the smaller dashed outline labeled by reference numeral 20. The power dissipation control circuit 20 has a first power supply leg 22 connected in parallel with a second power supply leg 24. A first switch SW1 is disposed in the first leg 22 and a second switch SW2 is disposed in the second leg 24. A voltage shift element 30 is also disposed in the second leg 24 in series with the second switch SW2.

The first and second legs 22 and 24 provide alternative paths between the high voltage terminal 14 and an internal power supply node labeled $V_{INT}$. The main circuit 12 is connected between the internal power supply node $V_{INT}$ and the low voltage or GND terminal 16. The states of the switches SW1 and SW2 are controlled by control circuitry 26. When the main circuit 12 is in an active mode, which for an SRAM memory array consists of reading data in from external circuitry or writing data out to external circuitry, the main circuit 12 requires full power at a normal operating voltage level. However, when the main circuit is in a quiescent mode, which in the case of an SRAM memory means merely maintaining the status of the data stored therein, it does not need full power at the normal operating voltage level. Instead, in the quiescent mode, it can maintain the status of the information stored in the memory array by applying a minimum voltage necessary to maintain a transistor in each memory cell array turned on. Such minimum voltage, or "holding" voltage, may be only a few tenths of a volt above the threshold voltage of a typical transistor used in each memory cell of the array.

For example, a typical memory cell transistor requires only about 0.6 volts to be maintained on. Some processes differentiate the doping used for making N-channel and P-channel transistors so that the N-channel transistor may require 0.6 volts to be maintained on, whereas the P-channel transistor may require about 0.8 volts to be maintained on. Thus, for a 4T type SRAM using all N-channel transistors, a holding voltage of about 1.0 volt applied to the internal power supply node $V_{INT}$ is sufficient to maintain the data stored in the memory array. For a 6T type SRAM memory, which uses both P-channel and N-channel transistors, a holding voltage of about 1.2 volts is sufficient to maintain the data stored in the memory array.

Accordingly, it will be appreciated that applying the full normal operating voltage to the memory array unnecessarily causes excessive power dissipation when the memory array is operating in the quiescent mode. Therefore, when the memory array is in the quiescent mode, the control circuitry 26 opens the first switch SW1 and closes the second switch SW2 so that power is supplied to the main circuit through the second leg 24. In the second leg 24, the voltage shift element 30 causes a voltage drop from the level of the normal operating voltage to the desired holding voltage level needed to maintain the status of the data stored in the memory array of the main circuit 12.

Referring to FIG. 2, a specific application of the invention will now be described. This application is useful for conserving battery power in a portable electronic device in which the main battery (not shown) supplies power at a normal operating voltage level designated $V_{cc}$. The integrated circuit device of FIG. 2 is designated generally by reference numeral 40 and includes a high voltage terminal, labeled $V_{cc}$ and a low voltage terminal labeled $V_{ss}$. The device 40 includes a main circuit 42, which may be a memory array such as an SRAM or a DRAM or may be any of various other integrated circuits having an active mode and quiescent mode.

The main circuit 42 is connected between an internal power supply node $V_{INT}$ and the low voltage terminal $V_{ss}$. A power dissipation control circuit 44 is connected between the high voltage terminal $V_{cc}$ and the internal power supply node $V_{INT}$. The power dissipation control circuit 44 has a first leg 46 connected in parallel with a second leg 48. The first leg 46 has a channel P-channel MOS transistor $T_1$ connecting the high-voltage terminal $V_{cc}$ to the internal power supply node $V_{INT}$. The second leg 48 has a first N-channel MOS transistor $T_2$ connected in series with a second N-channel MOS transistor $T_3$ in a path connecting the high voltage terminal $V_{cc}$ to the internal power supply node $V_{INT}$. Transistor $T_3$ is connected in a well-known manner with its gate connected to its drain to function like a diode.

Control circuitry 50 controls the on and off states of the transistors $T_1$ and $T_2$ by means of a control signal $V_{CTR}$ applied at a common connection between the gates of transistors $T_1$ and $T_2$. Thus, when transistor $T_1$ is on, transistor $T_2$ is off, and vice versa. Control circuitry 50 operates in response to an external signal S applied to the integrated circuit device 40. For example, incoming signal S may transmit chip select and chip deselect signals from other circuitry external to the integrated circuit device. The control circuitry 50 interprets signal S to apply $V_{CTR}$ as a low voltage signal turning on transistor $T_1$ and turning off transistor $T_2$ when the integrated circuit device 40 has been selected or "enabled" by signal S for normal operation. Under such circumstances, the normal $V_{cc}$ operating voltage is applied to the main circuit 42, with essentially no drop across transistor $T_1$, because it is turned on hard. When the integrated circuit device 40 has been deselected by incoming signal S, the control circuitry 50 generates control signal $V_{CTR}$ at a high voltage level to turn off transistor $T_1$ and turn on transistor $T_2$. Under these circumstances, the voltage $V_{cc}$ is reduced by the voltage drops across transistors $T_2$ and $T_3$ before appearing that the internal power supply node $V_{INT}$. Although transistor $T_2$ is specifically illustrated as an N-channel transistor, it could be implemented as a P-channel transistor driven by an inverted $V_{CTR}$ signal. However, the increased voltage drop provided by the N-channel transistor $T_2$ as shown may be preferred in the particular implementation of the invention.

Based upon the respective levels of the normal voltage supply $V_{cc}$ and the minimum holding voltage needed at node $V_{INT}$, one or more additional transistors, such as transistor $T_3$, can be connected in series in the second leg 48. For example, referring briefly to FIG. 4, two N-channel transistors $T_A$ and $T_B$ are shown connected in series and each with its gate connected to its drain to provide double the voltage drop of the single transistor $T_3$ in FIG. 2. Accordingly, the voltage drop in the second leg 48 of the power dissipation control circuit 44 can be adjusted appropriately to reduce the voltage level down from $V_{cc}$ to approximately the minimum holding voltage necessary for maintaining the condition of the main circuit 42 in its quiescent state. It will be appreciated that this application of the inventive circuit will extend the operating time of a battery-operated portable electronic device by reducing the power dissipation of integrated circuit devices such as SRAM memory devices when they are deselected and are merely maintaining data in a quiescent state.

Now referring to FIG. 3, another implementation of the inventive circuit will be described in the context of a battery backed-up SRAM. FIG. 3 shows an integrated circuit device designated generally by a reference numeral 60. The integrated circuit device 60 includes a main circuit 62, which in this case is an SRAM memory array. It may be either a 4T type or a 6T type SRAM as previously described.

The main circuit 62 is normally powered by a conventional external power supply (not shown) connected at a high voltage terminal $V_{cc}$ and a low voltage terminal $V_{ss}$. A backup battery $V_{BAT}$ is connected to provide a source of power to the main circuit 62 when the external power supply fails. Typically, such a backup battery is a small battery attached directly to the housing (not shown) of the integrated circuit device 60.

The backup battery $V_{BAT}$ has a negative terminal 64 and a positive terminal 66. The negative terminal 64 is connected to the low voltage terminal $V_{ss}$. The main circuit 62 is connected between an internal power supply node $V_{INT}$ and the low voltage terminal $V_{ss}$. A first power supply leg 68 connects the high voltage terminal $V_{cc}$ to the internal power supply node $V_{INT}$ through a P-channel MOS transistor $T_1$. A second power supply leg 70 connects the positive terminal 66 of the backup battery $V_{BAT}$ to the internal power supply node $V_{INT}$ through series-connected N-channel transistors $T_2$ and $T_3$.

Control circuitry 72 connected to the high voltage terminal $V_{cc}$ and the positive terminal 66 of the backup battery $V_{BAT}$ determines whether power will be supplied to the main circuit 62 through the first leg 68 or the second leg 70. The gates of transistors $T_1$ and $T_2$ are connected together at a node that receives a control signal $V_{CTR}$ generated by the control circuitry 72. The control circuitry 72 senses the level of the voltage on the high voltage terminal $V_{cc}$ and compares it to an internally generated reference voltage that indicates whether the voltage level on the high voltage terminal $V_{cc}$ has fallen to the level requiring backup battery operation. The control circuitry 72 generates control signal $V_{CTR}$ at a low level (i.e., at ground or $V_{ss}$) whenever the voltage level on the high voltage terminal $V_{cc}$ is above the reference voltage. This keeps transistor $T_1$ turned on and transistor $T_2$ turned off so that the main circuit 62 is powered directly from the external voltage source through the $V_{cc}$ connection. However, whenever the voltage level on the high voltage terminal $V_{cc}$ drops below the reference voltage, the control circuitry 72 generates control signal $V_{CTR}$ at a high level sufficient to turn off transistor $T_1$ and turn on transistor $T_2$ so that power is supplied to the main circuit 62 by the backup battery $V_{BAT}$ through the second leg 70 and the series-connected transistors $T_2$ and $T_3$ therein.

As in FIG. 2, the transistor $T_3$ of FIG. 3 serves as a voltage shift element providing one turn-on threshold voltage drop to reduce the voltage level at the internal power supply node $V_{INT}$ to a minimal holding voltage level required to maintain the data stored in the memory of the main circuit 62. And as previously mentioned, two or more such diode-connected N-channel transistors (e.g., see FIG. 4) can be substituted for the single transistor $T_3$ of FIG. 3. Furthermore, the voltage shift element 30 described generically in the context of FIG. 1 need not be implemented as diode-connected MOS transistors, such as the transistor $T_3$ in FIGS. 2 and 3, but can instead be implemented by other circuit elements, such as those described below.

FIG. 5 shows a resister R as an alternative to the diode-connected MOS transistor $T_3$ of FIGS. 2 and 3. The resister R can be fabricated in an integrated circuit device using various known techniques to provide a high resistance value. For example, the resistor R could be constructed in a strip of high resistivity polycrystalline silicon ("polysilicon"). Such high resistance polysilicon resisters are commonly employed as load elements in 4T type SRAM memory cells.

However, a rectifying element, such as a diode or diode-connected transistor, is preferred to a non-rectifying resistor as a voltage shift element, since a rectifying element will provide a more predictable voltage drop compared to a resistor. Furthermore, if the external power applied at the $V_{cc}$ terminal momentarily collapses and then returns to a normal level, data could be lost but for the inclusion of a rectifying-type voltage shift element. For example, operation of the integrated circuit device 40 of FIG. 2 in the quiescent mode would benefit from the use of a rectifying-type voltage shift element (i.e., transistor $T_3$) in the event that $V_{cc}$ momentarily collapses.

FIG. 6 shows the alternative of using one or more series-connected diodes $D_A$ and $D_B$ in lieu of the transistor $T_3$ in FIGS. 2 and 3. One or more such diodes $D_A$ and $D_B$ can serve as the voltage shift element 30 of FIG. 1 since each such diode would provide a voltage drop equal to one turn-on threshold of about 0.6 volts in a manner similar to the threshold voltage drop provided by transistor $T_3$ of FIGS. 2 and 3. The diodes $D_A$ and $D_B$ of FIG. 6 can be implemented in a conventional manner as depicted in FIG. 7 wherein N+ and P+ doped regions are provided in a P-well 76 formed in a substrate 78 using conventional techniques.

FIGS. 8 and 9 show additional alternatives for making the equivalent of a diode in an integrated circuit by fabricating a bipolar transistor and connecting its base to its collector. FIG. 8 shows an NPN bipolar transistor $T_{NPN}$ connected to provide a diode equivalent. FIG. 9 shows a PNP bipolar transistor $T_{PNP}$ connected to provide a diode equivalent. Either of these diode-connected bipolar transistors can serve as a voltage shift element in a manner similar to the diode-connected N-channel transistor $T_3$ of FIGS. 2 and 3.

FIG. 10 shows an implementation of a transistor that provides a higher than normal threshold voltage and correspondingly higher voltage drop when used in the circuit of the present invention. The transistor of FIG. 10, which is designated generally by reference numeral 80, is a modified form of a lightly doped drain ("LDD") type transistor. The transistor 80 is an N-channel MOSFET having a gate layer 82 disposed above a gate oxide layer 84 and includes conventional LDD type oxide spacers 86 and 88 at the sides of the gate 82. The transistor 80 has source and drain regions 90 and 92, which are entirely heavily doped. Dashed regions 94 and 96 indicate the location where the lightly doped drain regions normally would have been formed, but in this case, no doping is provided in these regions. Therefore, the source and drain regions 90 and 92 do not extend under the gate 82 as in the conventional MOSFET device. This modified form of an N-channel MOSFET provides a transistor having a higher than normal turn-on threshold voltage. For example, such a device of this type can be fabricated having a threshold voltage in the range from 1.2 to 2.0 volts.

Using the transistor 80 of FIG. 10 to advantage, the switch SW2 and voltage shift element 30 of FIG. 1 can be implemented with a single high threshold transistor of this type. In the specific circuits of FIGS. 2 and 3, transistor $T_2$ can be implemented using such a high threshold voltage transistor so that it may not be necessary to include any additional transistor $T_3$ in series with it in order to achieve the desired voltage drop in that leg of the circuit.

Although a preferred high threshold voltage transistor useful in the present invention is the type depicted in FIG. 10, there are other ways of increasing the turn-on threshold voltage of a transistor. For example, the gate oxide can be made thicker or the doping in the channel can be adjusted. Such other types of high threshold voltage transistors can be substituted to provide the desired voltage drop achieved by transistors $T_2$ and $T_3$ of FIGS. 2 and 3.

From the foregoing description, it will be appreciated that the integrated circuit device of the present invention can achieve significantly reduced power dissipation when operating in a quiescent or battery backup mode. In an SRAM implementation, the main operational circuit can be operated just above the minimum holding voltage level to maintain the data stored in the device. Because the main circuit is operated at a lower voltage, the power dissipation is significantly reduced. Therefore, it will be appreciated that the present invention has advantageous application in integrated circuit devices having backup batteries as well as with integrated circuit devices used in portable electronic equipment.

Although preferred embodiments of the invention have been described in detail, it will be understood by those skilled in the art that various modifications can be made therein without departing from the spirit and scope of the invention as set forth in the appended claims.

What is claimed is:

1. An integrated circuit device for use with external power supplied by high and low voltage terminals, the high voltage terminal providing a normal operating voltage to the device, comprising:

an internal power supply node;

a main circuit connected between the internal power supply node and the low voltage terminal; and a power dissipation control circuit connected between the high voltage terminal and the internal power supply node, the power dissipation control circuit having first and second parallel legs connected to the internal power supply node, a first switch disposed in the first leg and a second switch disposed in the second leg, a voltage shift element disposed in the second leg in series with the second switch and wherein the voltage shift element comprises at least one rectifying element providing a voltage drop in the second leg of at least one turn-on threshold when said second switch is on, and control circuitry controlling the operation of the first and second switches, the control circuitry turning the first switch on and the second switch off to connect the high voltage terminal directly to the internal power supply node when the main circuit is in an active mode, the control circuitry turning the first switch off and the second switch on to supply current through the voltage shift element to the internal power supply node when the main circuit is in a quiescent mode, whereby the voltage shift element lowers the voltage on the internal power supply node to a holding voltage below the level of the normal operating voltage.

2. The integrated circuit device of claim 1 further comprising:
a backup battery connected to supply power to the main circuit though the second leg of the power dissipation control circuit.

3. The integrated circuit device of claim 1 wherein the rectifying element comprises an N-channel MOSFET with its gate connected to its drain.

4. The integrated circuit device of claim 1 wherein the rectifying element comprises a PN junction diode.

5. The integrated circuit device of claim 1 wherein the rectifying element comprises an NPN bipolar transistor with its base connected to its collector.

6. The integrated circuit device of claim 1 wherein the rectifying element comprises an PNP bipolar transistor with its base connected to its collector.

7. An integrated circuit device for use with external power supplied by high and low voltage terminals, the high voltage terminal providing a normal operating voltage to the device, comprising:
an internal power supply node;
a main circuit connected between the internal power supply node and the low voltage terminal; and
a power dissipation control circuit connected between the high voltage terminal and the internal power supply node, the power dissipation control circuit having first and second parallel legs connected to the internal power supply node, a first switch disposed in the first leg and a second switch disposed in the second leg, a voltage shift element disposed in the second leg in series with the second switch wherein the voltage shift element comprises a resistor, and control circuitry controlling the operation of the first and second switches, the control circuitry turning the first switch on and the second switch off to connect the high voltage terminal directly to the internal power supply node when the main circuit is in an active mode, the control circuitry turning the first switch off and the second switch on to supply current through the voltage shift element to the internal power supply node when the main circuit is in a quiescent mode, whereby the voltage shift element lowers the voltage on the internal power supply node to a holding voltage below the level of the normal operating voltage,
and a backup battery connected to supply power to the main circuit through the second leg of the power dissipation circuit.

8. The integrated circuit device of claim 7 wherein the resistor comprises high resistivity polycrystalline silicon.

9. An integrated circuit device for use with external power supplied by high and low voltage terminals, the high voltage terminal providing a normal operating voltage to the device, comprising:
an internal power supply node;
a main circuit connected between the internal power supply node and the low voltage terminal;
a power dissipation control circuit connected between the high voltage terminal and the internal power supply node, the power dissipation control circuit having first and second parallel legs with first ends thereof connected together at the high voltage terminal and with second ends thereof connected together at the internal power supply node, a first MOS transistor disposed in the first leg and a second MOS transistor disposed in the second leg and with the gates of the first and second transistors being commonly connected, a voltage shift element disposed in the second leg in series with the second transistor, and control circuitry connected to and providing control signals to the commonly connected gates of the first and second transistors, the control circuitry turning on the first transistor and turning off the second transistor to connect the high voltage terminal directly to the internal power supply node when the integrated circuit device receives a chip select signal causing the device to operate in an active mode, the control circuitry turning off the first transistor and turning on the second transistor to supply current from the high voltage terminal to the main circuit solely through the second leg when the integrated circuit device receives a chip deselect signal causing the device to operate in a quiescent mode, whereby the voltage shift element lowers the voltage on the internal power supply node to a holding voltage below the level of the normal operating voltage when the device is in the quiescent mode.

10. The integrated circuit device of claim 9 wherein the voltage shift element comprises at least one rectifying element providing a voltage drop in the second leg of at least one turn-on threshold when the second MOS transistor is on.

11. The integrated circuit of claim 10 wherein the first MOS transistor is a P-channel MOSFET, the second MOS transistor is an N-channel MOSFET, and the rectifying element is an N-channel MOSFET with its gate connected to its drain.

12. A battery backed-up integrated circuit device having power dissipation control capability, comprising:
a backup battery having positive and negative terminals;
high and low voltage supply terminals for connection to an external power source, the low voltage supply terminal being connected to the negative terminal of the backup battery;
an internal power supply node;
a control signal node;
a main circuit connected between the internal power supply node and the low voltage supply terminal;
a first power supply leg connecting the high voltage supply terminal to the internal power supply node;
a second power supply leg connecting the positive terminal of the backup battery to the internal power supply node;
a first transistor disposed in the first power supply leg and connected to the control signal node to selectively drive the internal power supply node by an external voltage applied to the high voltage supply terminal;

a second transistor disposed in the second power supply leg and connected to the control signal node to selectively drive the internal power supply node by the voltage supplied by the backup battery;

a voltage shift element disposed in the second power supply leg in series with the second transistor; and control circuitry connected to the high voltage supply terminal, the control signal node, and the positive terminal of the backup battery, the control circuitry generating a control signal to selectively turn on and turn off the first and second transistors in response to the voltage level on the high voltage supply terminal, whereby the first transistor is turned on and the second transistor is turned off whenever the voltage level is above a reference voltage, and whereby the first transistor is turned off and the second transistor is turned on whenever the voltage level is below the reference voltage.

13. The device of claim 12 wherein the voltage shift element is integrated as part of the second transistor, and the second transistor has a relatively high threshold voltage.

14. The device of claim 12 wherein the main circuit is an SRAM memory.

15. The device of claim 14 wherein the voltage shift element comprises at least one rectifying element providing a voltage drop in the second power supply leg of at least one turn-on threshold when the second transistor is on, whereby the voltage shift element lowers the voltage on the internal power supply node to a holding voltage of at least one turn-on threshold below the voltage level of the backup battery.

16. The device of claim 15 wherein the rectifying element comprises an N-Channel MOSFET with its gate connected to its drain.

17. The device of claim 15 wherein the rectifying element comprises a PN junction.

18. An integrated circuit device for use with external power supplied by high and low voltage terminals, the high voltage terminal providing a normal operating voltage to the device, comprising:

an internal power supply node;

a main circuit connected between the internal power supply node and the low voltage terminal; and a power dissipation control circuit connected between the high voltage terminal and the internal power supply node, the power dissipation control circuit having first and second parallel legs connected to the internal power supply node, a first switch disposed in the first leg and a second switch disposed in the second leg, a voltage shift element disposed in the second leg in series with the second switch and wherein the voltage shift element and the second switch are integrated as a single N-channel transistor having a relatively high threshold voltage, and control circuitry controlling the operation of the first and second switches, the control circuitry turning the first switch on and the second switch off to connect the high voltage terminal directly to the internal power supply node when the main circuit is in an active mode, the control circuitry turning the first switch off and the second switch on to supply current through the voltage shift element to the internal power supply node when the main circuit is in a quiescent mode, whereby the voltage shift element lowers the voltage on the internal power supply node to a holding voltage below the level of the normal operating voltage; and a backup battery connected to supply power to the main circuit though the second leg of the power dissipation control circuit.

19. The integrated circuit device of claim 18 wherein the N-channel transistor comprises an LDD type transistor whose source and drain regions are entirely heavily doped and lack lightly doped drain portions.

* * * * *